(12) United States Patent
Torok et al.

(10) Patent No.: US 10,739,751 B2
(45) Date of Patent: Aug. 11, 2020

(54) APPARATUS FOR FACILITATING EVALUATING RECHARGEABLE BATTERIES

(71) Applicant: INTERNATIONAL BUSINESS MACHINES CORPORATION, Armonk, NY (US)

(72) Inventors: John G. Torok, Poughkeepsie, NY (US); Noah Singer, New City, NY (US); David C. Long, Wappingers Falls, NY (US); Prabjit Singh, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 68 days.

(21) Appl. No.: 16/010,636

(22) Filed: Jun. 18, 2018

(65) Prior Publication Data
US 2019/0384254 A1 Dec. 19, 2019

(51) Int. Cl.
G05B 19/406 (2006.01)
G01R 31/36 (2020.01)

(52) U.S. Cl.
CPC .. *G05B 19/406* (2013.01); *G05B 2219/45135* (2013.01)

(58) Field of Classification Search
CPC .................... G05B 19/406; G05B 2219/45135
See application file for complete search history.

(56) References Cited

U.S. PATENT DOCUMENTS 6,177,799 B1 * 1/2001 Martineau ................ G01B 7/24
324/425
9,658,146 B2 5/2017 Olson et al.
(Continued)

FOREIGN PATENT DOCUMENTS

CN 104062598 A 9/2014
CN 204732493 U 10/2015
(Continued)

OTHER PUBLICATIONS

Mel, et al., "The NIST Definition of Cloud Computing," National Institute of Standards and Technology, Information Technology Laboratory, Special Publication 800-145, Sep. 2011, (pp. 1-7).
(Continued)

*Primary Examiner* — Thomas C Lee
*Assistant Examiner* — Anzuman Sharmin
(74) *Attorney, Agent, or Firm* — Tihon Poltavets, Esq.; Kevin P. Radigan, Esq.; Heslin Rothenberg Farley & Mesiti P.C.

(57) ABSTRACT

A spot welding-type system is provided adapted to facilitate evaluating a rechargeable battery. The system includes first and second electrodes to contact the rechargeable battery. The first electrode includes a first contact surface to facilitate inducing an internal short circuit within the rechargeable battery during operation of the spot welding-type system, and the second electrode includes a second contact surface to contact the rechargeable battery. The first and second contact surfaces are dissimilar contact surfaces, and the second contact surface is larger than the first contact surface. The system with the rechargeable battery disposed between the first and second contact surfaces produces, in operation, a localized pressure on, and a localized heating of, the rechargeable battery in a spot-sized region where the first contact surface contacts the rechargeable battery to facilitate
(Continued)

generating and evaluating a potential internal short circuiting of the rechargeable battery.

20 Claims, 13 Drawing Sheets

(56) References Cited

U.S. PATENT DOCUMENTS

| | | | | |
|---|---|---|---|---|
| 2008/0143337 | A1* | 6/2008 | Fujikawa | H01M 10/052 324/426 |
| 2009/0261835 | A1* | 10/2009 | Iwanaga | H01M 6/50 324/426 |
| 2010/0136393 | A1 | 6/2010 | Takezawa et al. | |
| 2014/0212752 | A1* | 7/2014 | Arakawa | H01M 4/131 429/212 |

FOREIGN PATENT DOCUMENTS

| | | |
|---|---|---|
| CN | 105974319 A | 9/2016 |
| CN | 106646257 A | 5/2017 |

OTHER PUBLICATIONS

Wu, et al., "Simulation of Internal Short Circuits in Lithium-Ion Cells," Corporate Research, UL LLC, (2013) (pp. 1-11).

Xia, et al., "Failure Analysis of Pinch-Torsion Tests as a Thermal Runaway Risk Evaluation Method of Li-Ion Cells," Journal of Power Sources 265 (2014) (pp. 356-362).

Feng, et al., "Characterization of Penetration Induced Thermal Runaway Propagation Process Within a Large Format Lithium Ion Battery Module," Journal of Power Sources 275 (2015) (pp. 261-273).

Wang, et al., "Thermal Runaway Risk Assessment by Mechanically Induced Internal Short Circuit," Oak Ridge National Laboratory, Project supported by DOE SERE VTP and NHTSA, managed by UT-Battelle for the Department of Energy (pp. 1-29).

Jeevarajan, Judith A., "Standardized Heating Method to Trigger and Prevent Thermal Runaway Propagation in Lithium-Ion Batteries," Tech Briefs Engineering solutions for Design & Manufacturing, https://www.techbriefs.com/component/content/article/tb/techbriefs/energy, [Retrieved from Internet on Jan. 19, 2018] (3 pages).

* cited by examiner

APPARATUS FOR FACILITATING EVALUATING RECHARGEABLE BATTERIES

BACKGROUND

There are a wide variety of rechargeable batteries available today for use as energy sources, including for use as backup energy sources. Lithium-ion batteries are one type of rechargeable battery in which lithium-ions move from a negative electrode to a positive electrode during discharge and back when charging. An intercalated lithium compound is used in a lithium-ion battery as one electrode material. The electrolyte, which allows for ionic movement, and the two electrodes are constituent components of a lithium-ion battery cell. A cell is a basic electrochemical unit that contains the electrodes, separator and electrolyte. A battery or battery pack is a collection of cells or cell assemblies. These may be ready for use by providing an appropriate housing, and electrical interconnections.

Recent events have highlighted the potential for thermal runaway events with the application of lithium-ion technology-based batteries. These events have typically been associated with two different types of causes, namely, an internal short circuit associated with a manufacturing or design defect, or a catastrophic failure due to an external event, such as an external heating event (e.g., fire). In either case, the triggering of the thermal runaway event is typically due to the degradation of the separator layer within the battery, thereby allowing the inception of an exothermic reaction to occur.

SUMMARY

Certain shortcomings of the prior art are overcome and additional advantages are provided through the provision of an apparatus for evaluating a rechargeable battery. The apparatus includes a spot welding-type system adapted to facilitate evaluating the rechargeable battery. The spot welding-type system includes a first electrode and a second electrode. The first electrode includes a first contact surface to facilitate inducing an internal short circuit within the rechargeable battery when in contact therewith during operation of the spot welding-type system. The second electrode includes a second contact surface to contact the rechargeable battery during operation of the spot welding-type system. The first and second contact surfaces are dissimilar contact surfaces, and the second contact surface is larger than the first contact surface. The spot welding-type system with the rechargeable battery held between the first and second contact surfaces produces, in operation, a localized force on, and a localized heating of, the rechargeable battery in a spot-sized region where the first contact surface contacts the rechargeable battery to facilitate evaluating a potential internal short circuiting of the rechargeable battery.

In another aspect, an apparatus for facilitating evaluating a rechargeable battery is provided. The apparatus includes a spot welding-type system adapted to facilitate evaluating the rechargeable battery. The spot welding-type system includes a first electrode and a second electrode. The first electrode includes a first contact surface to facilitate inducing an internal short circuit within the rechargeable battery when in contact therewith during operation of the spot welding-type system. The second electrode includes a second contact surface to contact the rechargeable battery during operation of the spot welding-type system. The first and second contact surfaces are dissimilar contact surfaces, and the second contact surface is larger than the first contact surface. The spot welding-type system further includes a controller, and the spot welding-type system with the rechargeable battery held between the first and second contact surfaces produces, in operation, a localized force on, and a localized heating of, the rechargeable battery in a spot sized region where the first contact surface contacts the rechargeable battery to facilitate evaluating a potential short circuiting of the rechargeable battery.

In a further aspect, a method of evaluating a rechargeable battery is provided. The method includes applying, via a spot welding-type system, a localized pressure and a localized heating to the rechargeable battery in a spot-sized region of the rechargeable battery to facilitate evaluating a potential internal short circuiting of the rechargeable battery. Applying, by the spot welding-type system, the localized pressure and the localized heating includes placing the rechargeable battery between a first electrode and a second electrode of the spot welding-type system. The first electrode is configured with a first contact surface to facilitate inducing an internal short circuit within the rechargeable battery during operation of the spot welding-type system, and the second electrode is configured with a second contact surface to contact the rechargeable battery. The first and second contact surfaces are dissimilar contact surfaces, and the second contact surface is larger than the first contact surface. The method further includes monitoring one or more properties associated with the rechargeable battery during applying of the localized pressure and the localized heating to the rechargeable battery by the spot welding-type system to facilitate evaluating the potential internal short circuiting of the rechargeable battery, and one or more resultant effects thereof.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description and this specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application to facilitate, for instance, providing an apparatus and method for evaluating a rechargeable battery, which utilize, in operation, a localized pressure on, and a localized heating of, the rechargeable battery in a spot-sized region where a first electrode contacts the rechargeable battery to facilitate evaluating a potential internal short circuiting of the rechargeable battery.

The illustrative embodiments may be described below using specific code, designs, architectures, protocols, layouts, schematics, or tools only as examples, and are not limited to the illustrative embodiments. Furthermore, the illustrative embodiments may be described in certain instances using particular software, tools, and data processing environments only as example for clarity of description. The illustrative embodiments may be used in conjunction with other comparable or similarly purposed structures, systems, applications, or architectures. An illustrative evaluation control embodiment may be implemented in hardware, software, or a combination thereof.

The examples in this disclosure are used only for clarity of description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed herein.

Figure 1:
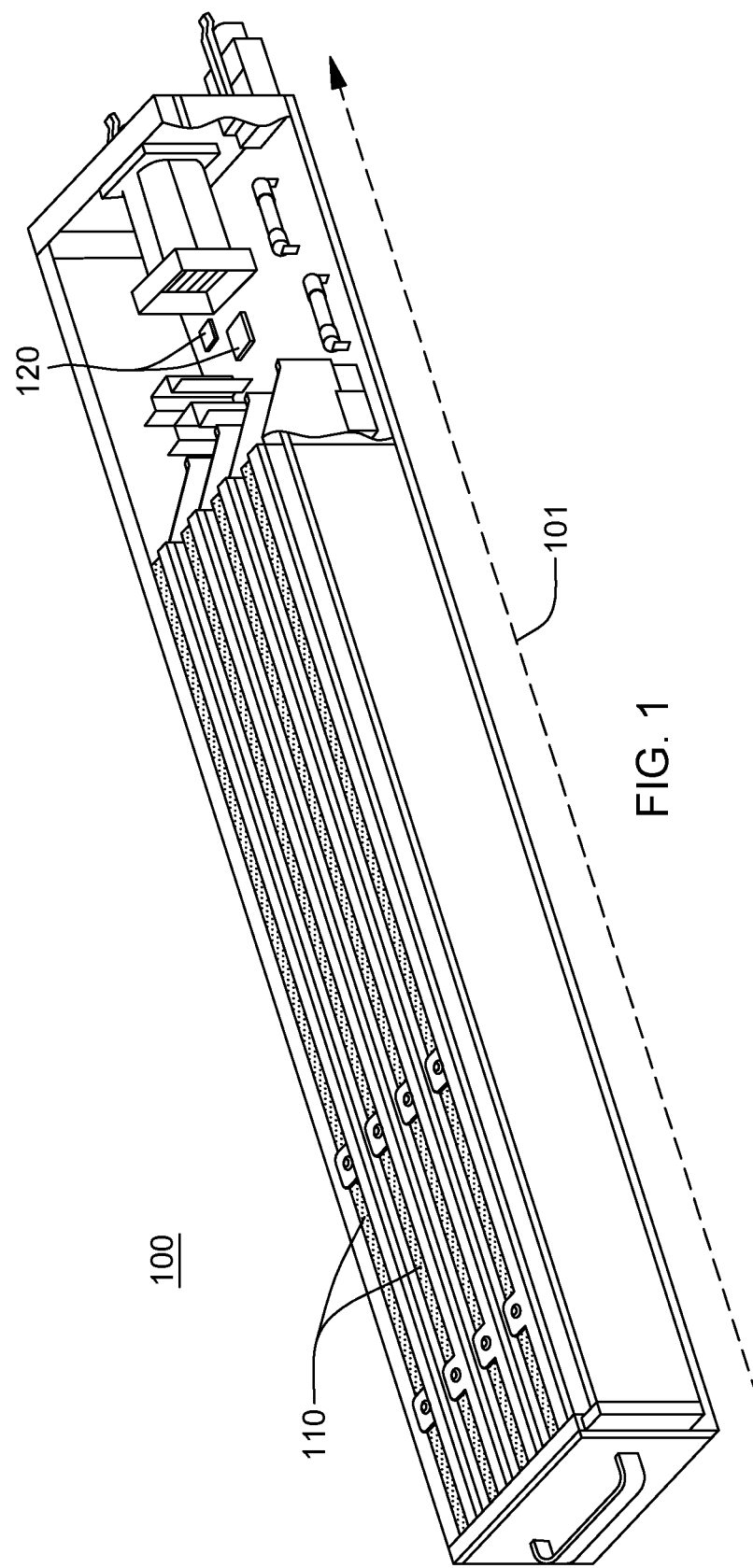
FIG. 1 depicts one embodiment of a battery pack system, which may have one or more battery cells to undergo evaluation using an apparatus, in accordance with one or more aspects of the present invention.

FIG. 1 depicts one embodiment of a battery pack system 100 including multiple batteries or battery cells 110 and associated components 120 configured as, for instance, a battery pack to, for example, provide standby power to one or more computing components of a computing or information technology (IT) rack for a specified time upon loss of main power. Depending on the implementation, a computing rack may include a number of battery pack systems, such as battery pack system 100 of FIG. 1, with each pack including a potentially large number of batteries or battery cells. When employed in a computing rack, a cooling airflow 101 may be provided through the rack to facilitate cooling the computing components disposed within the rack, including, for instance, the battery pack system(s). In one or more embodiments, the battery cells employed in the battery pack are rechargeable battery cells, such as rechargeable lithium-ion battery cells, by way of example. Components 120 may include, in part, any conventional components associated with the battery pack system to facilitate, for instance, charging or discharging of the battery cells when appropriate to provide, for instance, backup power to one or more components within the computing rack, as well as, in part, to control and monitor components to implement one or more safety procedures.

Note that the battery pack system embodiment of FIG. 1 is presented by way of example only of one embodiment of a complex system within which rechargeable battery packs may be used. Rechargeable battery packs may be used in a wide variety of products, including in backup or standby applications, standby and/or standalone applications, as well as standalone applications. In a backup or standby application, the battery pack may generally be connected to a power source via a charger. Examples include various backup power systems, such as that depicted in FIG. 1, for a data center computing rack. In a standby and/or standalone application, the battery pack may be connected at different times to a power source across a charger, such as may be the case with an electric vehicle or electric forklift, by way of example. At other times, the battery pack is unconnected to the power source, such as when the electric vehicle or forklift is in use. In a standalone application, the battery pack is typically not connected to a charger most of the time, such as in the case of a mobile phone or a laptop computing device. In any of these applications a potential for a thermal runaway event needs to be evaluated, and the effects of such an event considered by designers of systems using such batteries.

System designers may address concerns with rechargeable batteries in a variety of ways. In order to address concerns, however, there is a basic, post-manufacture need to evaluate rechargeable batteries, or battery cells, including possibly under various conditions. As discussed, where manufactured with a defect, or handled improperly, certain rechargeable batteries can experience thermal runaway resulting in potentially catastrophic overheating. Sealed cells may even explode violently if safety vents are overwhelmed, or nonfunctional. Particularly prone to thermal runaway are lithium-ion technology-based batteries, which as noted are a popular type of rechargeable battery for many applications.

Figure 2:
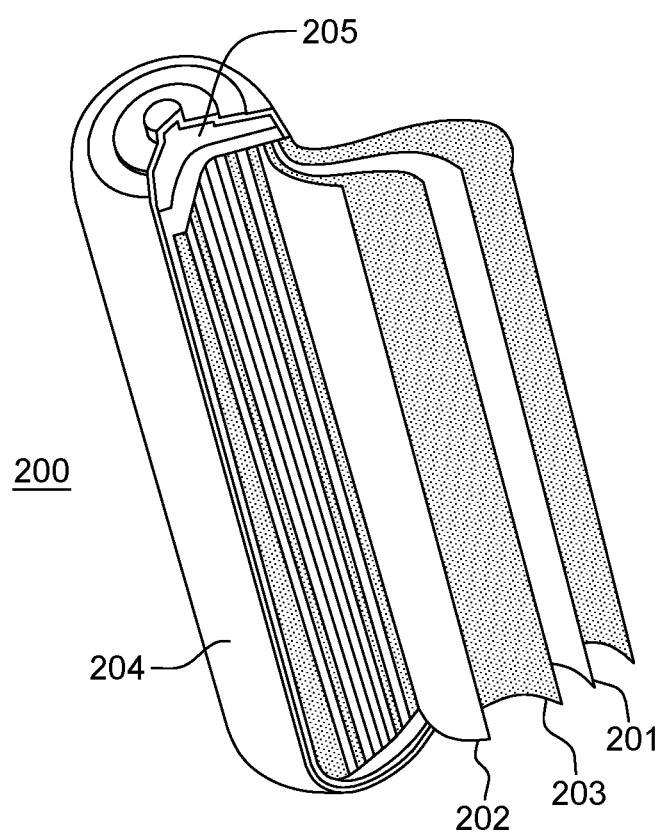
FIG. 2 depicts one embodiment of the structure of a rechargeable battery, or battery cell, to undergo evaluation using an apparatus, in accordance with one or more aspects of the present invention.

Different lithium-ion batteries offer different internal designs and venting schemes to prevent thermal runaway from occurring. FIG. 2 depicts one example of a cylindrical lithium-ion battery (or battery cell) 200 where an anode 201 and a cathode 202 are separated by a separator 203. In this example, the battery cell includes an outer case 204, such as a metal case, which holds a long spiral including three thin sheets pressed together, that is, the anode 201, cathode 202 and separator 203. Inside the case, these sheets may be submerged in an organic solvent that acts as the electrolyte. Ether is one common solvent. The separator may be a thin sheet of microperforated plastic. As the name implies, it separates the anode and cathode (positive and negative electrodes), while allowing ions to pass through. In one or more embodiments, the positive electrode may be made of lithium cobalt oxide, and the negative electrode may be made of carbon. When the battery charges, ions of lithium move through the electrolyte from the positive electrode to the negative electrode and attach to the carbon. During discharge, the lithium-ions move back to the lithium cobalt oxide from the carbon. The movement of lithium-ions happens at a fairly high voltage, so each cell may produce, for instance, 3.7 volts. Today, the metal case typically includes a pressure sensitive vent 205. Should the battery cell ever become so hot that it risks exploding from over pressure, vent 205 releases the extra pressure to prevent an explosion from occurring. Note that the cylindrical cell depicted is only one type of possible lithium-ion battery cell, as there are a wide variety of packaged cells available, including prismatic and pouch cells, as well as others.

Significant to the use of rechargeable batteries, including lithium-ion batteries, for different applications is the ability to quantify the effects of a failure event to assist with the design of the physical packaging (containment) and battery management schemes, with each being designed (for instance) to minimize negative effects should a failure event occur within the rechargeable battery. Certain elements associated with this process include the state of health (SOH), state of charge (SOC), voltage degradation, internal battery and near-vicinity ambient temperatures during the event, and vented gas pressure, volume (per cell) and gas chemistry during or due to a failure event. Various approaches have been suggested to facilitate evaluating rechargeable batteries. For instance, one approach has been to create a heating event by wrapping the battery cell with a heat source. Although successful in generating a failure, such an approach can only mimic an external heating of the cell as a root cause for battery failure. Further, this mimicking of external heating of the cell typically requires a significant amount of applied heating time to cause degradation of the separator within the cell. Although interesting, this approach does not provide an adequate approach to representing the localized effect and rapid nature of a failure caused by or associated with an internal electrical shorting through the cell's separator layer.

Thus, certain novel apparatuses and methods are disclosed herein which utilize, in part, a spot welding-type system as a mechanism to create and establish local damage internal to a rechargeable battery being evaluated, such as a lithium-ion battery, and more particularly, to cause damage to an internal separator layer within the rechargeable battery without puncturing the outer casing. In doing so, the apparatuses and methods disclosed herein more accurately mimic a localized electrical shorting event associated with a manufacturing or design defect, which is typically very small in size, as well as providing a less encumbered mechanism to capture data during the generated failure of the rechargeable battery. In particular, the apparatuses and methods disclosed herein provide an approach to inducing thermal runaway within a battery cell resulting from an internal manufacturing or design defect. Further, the apparatus presented allows for repeatable characterization of a rechargeable battery, including battery cell venting and robustness. The apparatuses and methods disclosed more accurately simulate thermal runaway than other available methods, and are safer, less expensive and simpler to implement than other methods. Further, the apparatus incorporates a spot welding-type system to provide localized heating and localized deformation of a cell casing to generate, for instance, a discrete defect or short circuiting through the separator layer of the battery cell. Methods are provided for evaluating the battery cell using the spot welding-type system to provide repeatable evaluation and robustness characterizations.

Generally stated, disclosed herein in one or more aspects is an apparatus for facilitating evaluating a rechargeable battery, or rechargeable battery cell. The apparatus includes a spot welding-type system which is adapted to facilitate evaluating the rechargeable battery. The spot welding-type system includes a first electrode including a first contact surface configured to facilitate inducing an internal short circuit within the rechargeable battery when in contact therewith during operation of the spot welding-type system. A second electrode includes a second contact surface to also contact the rechargeable battery during operation of the spot welding-type system. The first and second contact surfaces are dissimilar contact surfaces, and the second contact surface is larger than the first contact surface. The spot welding-type system, with a rechargeable battery disposed between the first and second contact surfaces, produces in operation, a localized pressure on, and a localized heating of, the rechargeable battery in a spot-sized region where the first contact surface contacts the rechargeable battery to facilitate evaluating a potential internal short circuiting of the rechargeable battery By way of example only, the term "spot-size" used herein may mean a spot of 5 mm diameter or less, such as in the range of 0.5 mm to 5 mm. However, depending on the specific application, it could be desirable to evaluate a spot-size outside of this particular range.

In one or more implementations, the spot welding-type system includes a controller. The controller controls (for instance, facilitates varying) one or more operational parameters of the spot welding-type system, including, for instance, an applied force by the first and second electrodes on the rechargeable battery, a duration of the applied force on the rechargeable battery, a magnitude of a pulse current applied to the rechargeable battery via the first and second electrodes, and a duration of the pulse current applied to the rechargeable battery. By way of example only, the force may be in the range of 0.1 lbs. to 10 lbs., and the magnitude of the applied current may be, for instance, in the range of 1 k-30 k amps, but may also be dependent on the application, and the apparatus itself. The pulse duration may, for instance, be a pulse in a range of 10 ms to 1 second, in one or more implementations.

In one or more embodiments, controlling by the controller the one or more operational parameters of the spot-welding type system facilitates applying a localized pressure and a localized heating to the rechargeable battery at levels to degrade a separator of the rechargeable battery and produce an internal short circuit. The controller controlling the one or more operational parameters of the spot welding-type system provides control over size of a defect produced in a separator of the rechargeable battery by application of the localized pressure and localized heating, resulting in an internal short circuit of the rechargeable battery. In one or more embodiments, the controller may be programmable to allow adjusting of the operational parameter(s) of the spot welding-type system.

In one or more embodiments, the apparatus may further include an enclosed chamber, such as a test chamber, where the first and second electrodes of the spot welding-type system may extend into the enclosed chamber. During operation of the spot welding-type system, the first and second contact surfaces hold a rechargeable battery between the electrodes, within the enclosed chamber. The enclosed chamber is a sealed chamber, and the apparatus includes sealing gaskets surrounding the first and second electrodes where the first and second electrodes extend into the enclosed chamber.

In one or more embodiments, the second contact surface of the second electrode may be configured to facilitate holding the rechargeable battery during operation of the spot welding-type system. Further, in one or more implementations, the first contact surface may be a convex contact surface, and the second contact surface may be flat or a concave contact surface. In one or more implementations, the first electrode may be the positive electrode, and the second electrode the negative electrode.

Figure 3:
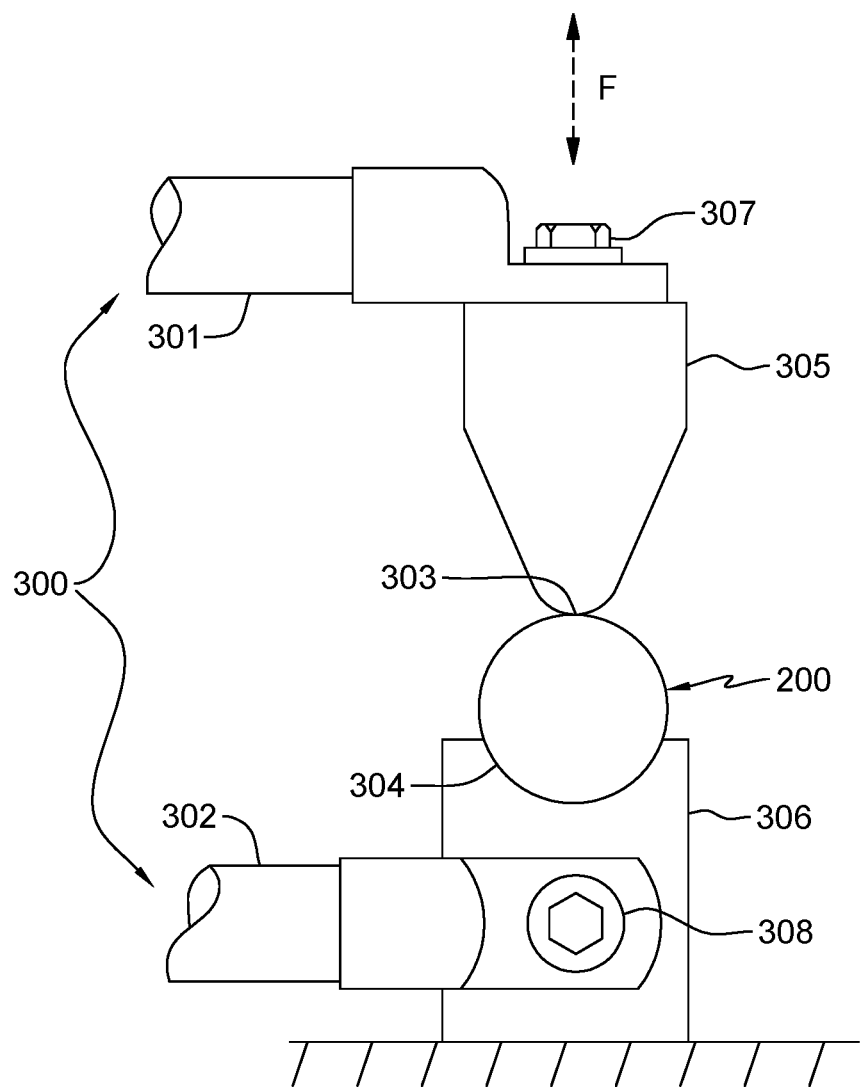
FIG. 3 is a partial depiction of one embodiment of an apparatus for evaluating a rechargeable battery, in accordance with one or more aspects of the present invention.

FIG. 3 depicts a partial embodiment of an apparatus 300 with a rechargeable battery 200 undergoing evaluation disposed between a first electrode 301 and a second electrode 302 of apparatus 300. Note that the particular configuration of rechargeable battery 200 is provide by way of example only, and not by way of limitation.

In the embodiment shown, first electrode 301 is configured with a replaceable tip 305 which has a first contact surface 303, and second electrode 302 is configured with a replaceable tip 306, which has a second contact surface 304. The replaceable tips 305, 306 may be secured to electrodes 301, 302 via any attachment mechanism 307, 308 designed, for instance, to allow the tips to be replaceable for different evaluation operations and/or for evaluating different types of rechargeable batteries, for instance, batteries of different shape and/or size. As explained herein, first and second electrodes 301, 302 of apparatus 300 are part of, or associated with, a spot welding-type system which provides a low voltage, such as in the range of approximately 2-5 volts, and a high current source similar to a spot welder implementation used to weld to metal components together. The spot welding-type system advantageously is configured to apply both a mechanical external force (F), as well as a localized heating of the cell in a region directly under first contact surface 303. In one or more implementations, first and second electrodes 301, 302 (including tips 305, 306) may be metal electrodes, such as copper electrodes. First contact surface 303 may be a convex surface as illustrated, and second contact surface 304 may be concave in one example. The second contact surface 304 is a relatively large surface compared to the first contact surface in order to provide for a larger contact area, and thus lower heating in the region of the battery cell opposite from where the first contact surface contacts the battery.

Figure 4:
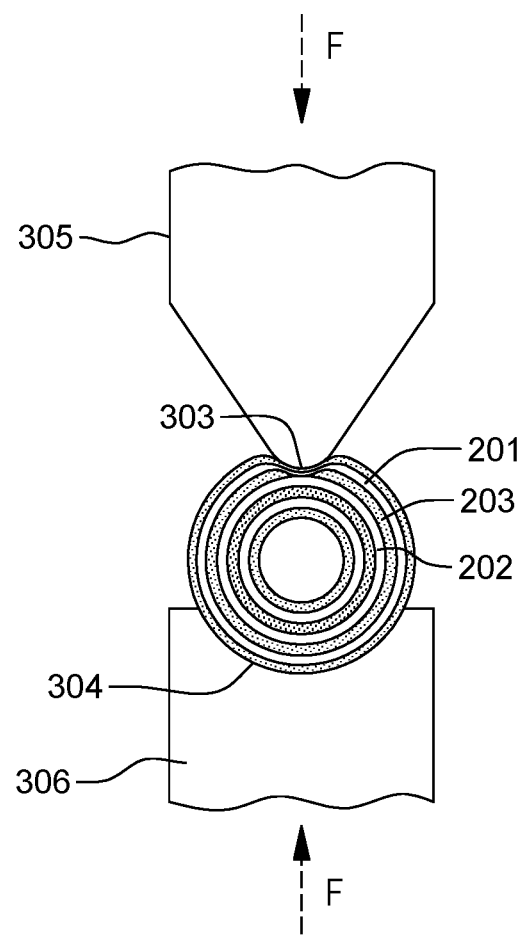
FIG. 4 is an enlarged partial depiction of the apparatus of FIG. 3 in operation causing a deformation and a localized heating in a spot-sized region of the battery to induce an internal short circuit in the battery cell for evaluation thereof, in accordance with one or more aspects of the present invention.

As explained, the configuration of the first and second electrodes is chosen in order to facilitate, in operation, the application of a localized pressure on, and a localized heating of, rechargeable battery 200 in a spot-sized region where the first contact surface contacts the rechargeable battery to facilitate in evaluating a potential short circuiting of the rechargeable battery. An example of this is depicted in FIG. 4 where the tips 305, 306 of the first and second electrodes are shown, along with their contact surfaces 303, 304 and a rechargeable battery 200. As illustrated in FIG. 4, rechargeable battery 200 may include (in one embodiment) spirally wound anode and cathode layers 201, 202, respectively, separated by a separator layer 203, as explained above. By applying a localized pressure and a localized heating to the battery cell a spot-sized defect is created in separator 203 as illustrated, resulting in shorting of the anode and cathode layers together, which more accurately mimics occurrence of a localized electrical short-circuiting event associated with a manufacturing or design defect (which as noted, may be very small in size).

Figure 5A:
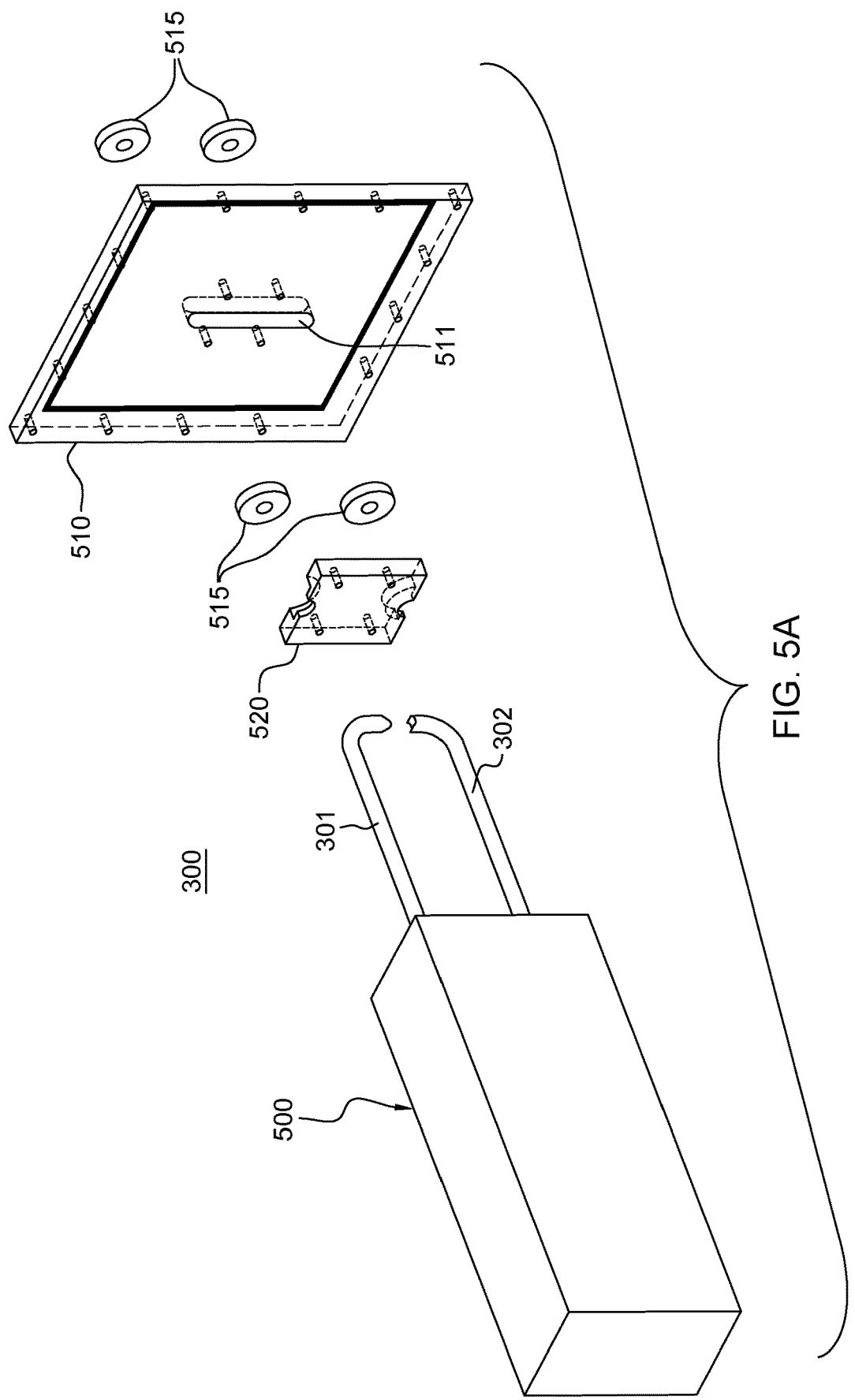
FIG. 5A depicts a partially exploded view of one embodiment of an apparatus for evaluating a rechargeable battery, in accordance with one or more aspects of the present invention.
Figure 5B:
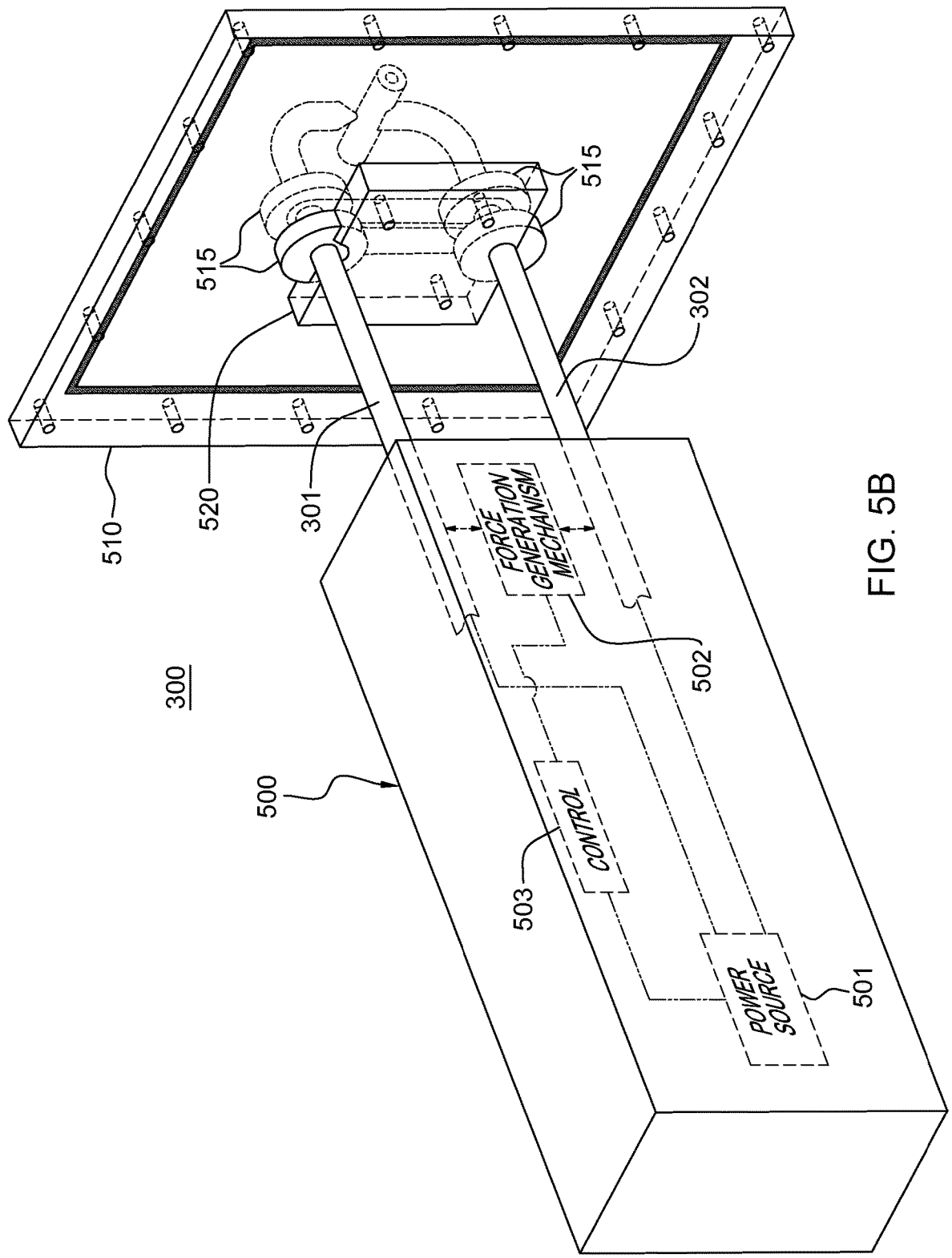
FIG. 5B depicts an assembled view of the apparatus of FIG. 5A for evaluating a rechargeable battery, in accordance with one or more aspects of the present invention.

FIGS. 5A & 5B depict one example of an apparatus 300 including a spot welding-type system 500, in accordance with one or more aspects of the present invention. In this embodiment, apparatus 300 includes, in addition to spot welding-type system 500, a pass-through plate 510, and a sealing plate 520 which cooperate along with O-ring or sealing gaskets 515 to allow first and second electrodes 301, 302 to project into an enclosed chamber, such as shown in FIG. 6.

As disclosed herein, the spot welding-type system 500 generates a relatively low voltage, and high current applied in pulses to create a very localized, rapid heating condition within the rechargeable battery when the battery is held between the first and second electrodes. The spot welding-type system disclosed advantageously allows for a significant amount of energy to be delivered to a spot-sized region of the battery cell in a very short time, such as approximately 10-100 milliseconds bursts, and it permits a localized heating, welding, or shorting to occur without excessive heating to the remainder of the battery cell. The ability to provide a localized pressure, and localized, rapid heating to a battery cell advantageously may be used to simulate an internal short circuiting of the rechargeable battery, or more particularly, the battery separator layer, due to manufacturing defect. This may be accomplished, in part, by providing the first and second electrodes with different shape characteristics. Since only a single localized effect may be desired, the electrodes may have dissimilar designs, with the first contact surface of the first electrode (that is, the defect side) being smaller compared with the second contact surface of the second contact electrode. Also, in one or more embodiments, the second contact surface may be shaped to accommodate (or nest) the rechargeable battery within the second contact surface. These contact surface differences, allow for the localized high heating, and globally low heating, of the battery cell to occur along with the localized deformation of the battery cell's exterior (without puncture), which results in a defect that is more appropriately representative of a condition associated with an internal short-circuiting event of a rechargeable battery. Note that using a spot welding-type system as disclosed herein may allow the battery to vent during the failure event, but the approach disclosed and subsequent evaluation mode may override the specific battery's internal venting system design, if desired. As such, the apparatus disclosed herein, and the methods of use thereof, may better represent the real world damaging effect associated with an internally derived electrical short circuit.

Referring collectively to FIGS. 5A & 5B, in one or more implementations, apparatus 300 may include a spot welding-type system 500 which has, for instance, a power source 501, a force generation mechanism 502, and a controller, or control system 503. The power source 501 may be configured to provide a low voltage, high current pulse signal of the desired duration to the rechargeable battery, and the force generation mechanism may be any known mechanism for generating a force between the first and second electrodes, and thus, a force onto the rechargeable battery when held between the first and second electrodes. By configuring the first and second electrodes as described herein, and in particular, the contact surfaces of the first and second electrodes, the force being applied is localized to the first contact surface, as is the heating resulting from the application of the pulse current to the rechargeable battery. The control 503 may be any control system or mechanism for controlling testing and/or evaluation of one or more rechargeable batteries as disclosed herein, and may include aspects that are resident within the spot welding-type system, as well as aspects that may be remotely implemented, for instance, at a central computer at a test facility, or even implemented as cloud-based aspects for the control and monitoring of the evaluation process.

Figure 6:
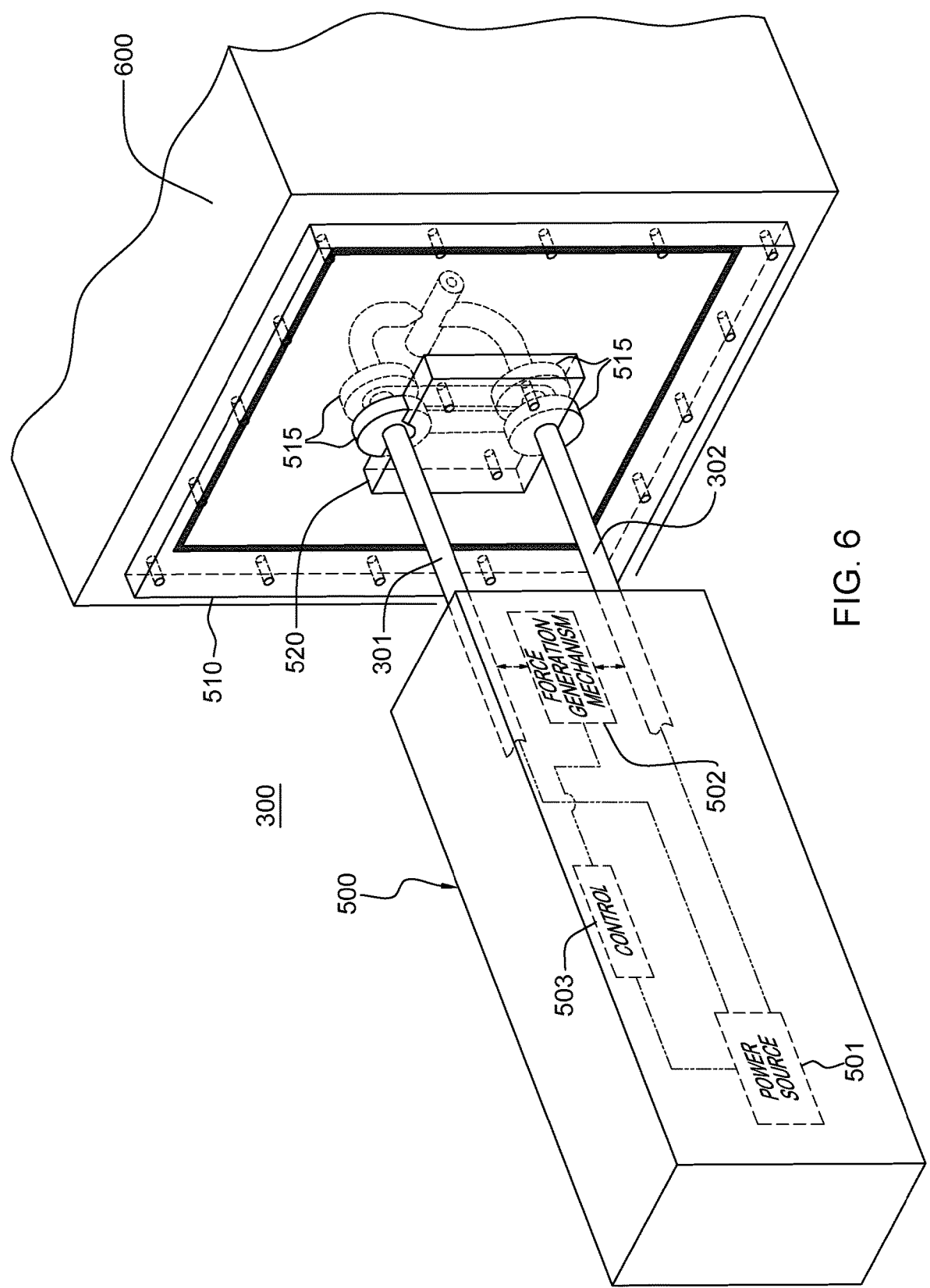
FIG. 6 depicts the apparatus of FIGS. 5A & 5B with the pass-through plate affixed to, and enclosing, a chamber to facilitate evaluating a rechargeable battery within an enclosed chamber, in accordance with one or more aspects of the present invention.

In one or more implementations, pass-through plate 510 is appropriately sized and configured to bolt or otherwise attach to a standard enclosed test chamber (such as shown in FIG. 6), with the first and second electrodes 301, 302 passing through an appropriately sized slot 511 in pass-through plate 510. Sealing plate 520, which could include bellows for added flexibility if desired, provides a mechanism to seal slot-shaped opening 511 in pass-through plate 510 after first and second electrodes 301, 302 have been inserted through the pass-through plate, as illustrated in FIG. 5B. Sealing gaskets 515, which may be O-rings and provide a gas tight sealing of the remaining opening between pass-through plate 510 and sealing plate 520, may be provided on both sides of pass-through plate 510, in one or more embodiments. As shown, sealing plate 520 bolts, or otherwise attaches to, pass-through plate 510 with the sealing gaskets disposed, on one side of pass-through plate 510, between the pass-through plate 510 and sealing plate 520, such as in part within appropriately sized recesses in the sealing plate.

As noted, FIG. 6 depicts apparatus 300 of FIGS. 3-5B, with pass-through plate 510 attached to an evaluation or test chamber 600 of the apparatus to allow for evaluation of the rechargeable battery within a sealed chamber, which may include a variety of monitoring devices in order to monitor the localized pressure and localized heating being applied to the rechargeable battery, one or more characteristics of the rechargeable battery itself, as well as one or more resultant effects of testing the battery, including an internal short circuiting being created within the rechargeable battery.

The apparatus disclosed herein provides numerous advantages over prior approaches to evaluating rechargeable batteries post manufacture. For instance, the apparatus disclosed provides an ability to vary the magnitude and duration of an applied external force to the rechargeable battery. In doing so, fine control of the defect inception site and size of the defect is established. This allows the size and location of the defect to be varied to identify specific cause and effect relationships, such as between the location of the battery defect and defect size, etc. The apparatus can be used to manual evaluate or test the rechargeable battery, or as part of an automated feedback loop. When applied as an automatic feedback loop, the loss of charge, reduction in battery cell voltage, etc., can each be quickly quantified as part of a design of experiments and employed to alter (e.g., reduce or remove) the external pressure and/or heating source. Further, surface temperature, change in voltage, explosion gas pressure can be measured readily, as well as the expelled or vented gas, which may be captured for chemical analysis within the enclosed chamber. The apparatus disclosed herein may also be used as a comparative mechanism to quantify the effects of the changes in internal battery designs, such as chemistry, materials, dimensions, shapes, etc. The enclosed chamber of the apparatus also facilitates or provides a mechanism to alter external environmental conditions during the evaluation process, as well as their effects on the resulting events. For instance, chamber pressure may be varied to simulate application elevation changes and/or atmospheric condition changes, as well as being filled with varying atmospheric gases (e.g., air, inert gas, etc.). This may be of value during the design of various containment structures for the rechargeable batteries within higher level complex systems.

Figure 7:
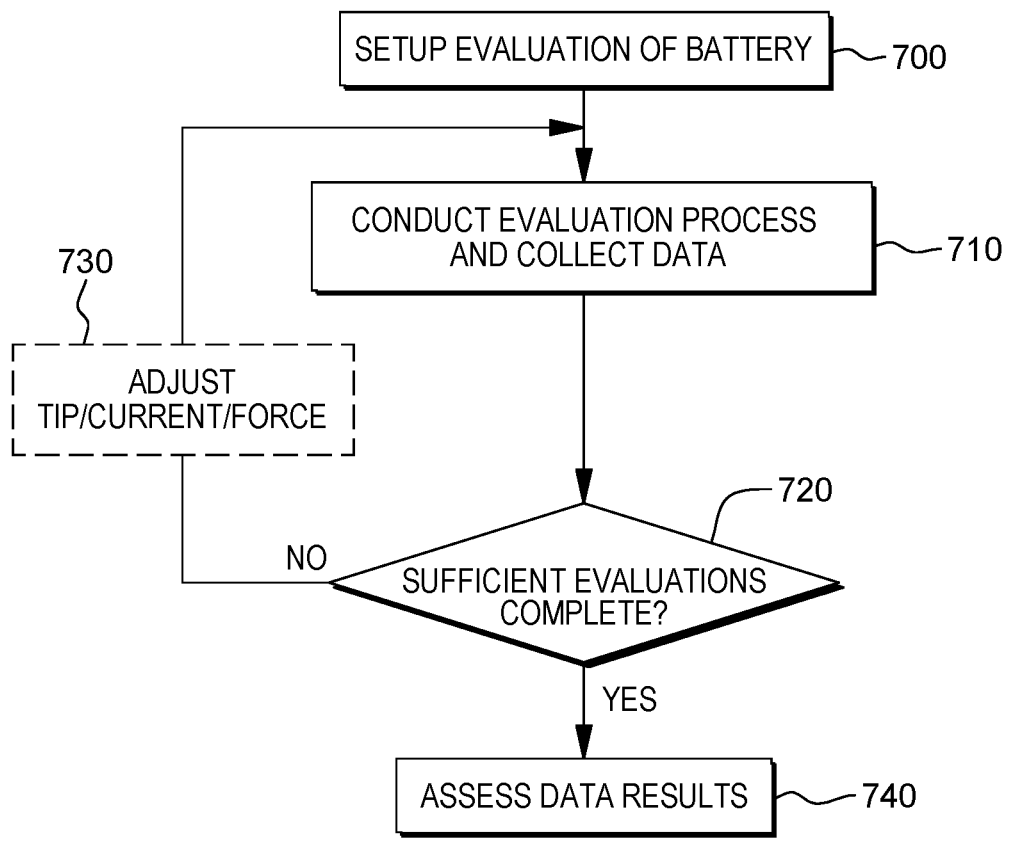
FIG. 7 depicts one embodiment of logic for evaluating a rechargeable battery using an apparatus, in accordance with one or more aspects of the present invention.

FIG. 7-9B depict various methods for using an apparatus, such as the apparatus described above in connection with FIGS. 3-6. Referring first to FIG. 7, logic for evaluating a rechargeable battery using an apparatus such as disclosed is depicted as including setting up evaluation of the rechargeable battery 700, and then conducting an evaluation process and collecting data during or as a result of the evaluation process 710. The logic may include determining whether a sufficient number of tests or evaluations have been completed 720. If "no", then the logic may return to conduct further evaluation processes, and collect further data 710. Note that when returning, one or more characteristics of the test, and in particular, the localized force and/or localized heating being applied to the rechargeable battery may be adjusted, such as for instance, the particular contact surface of the electrode, by changing electrode tips, the applied current magnitude or duration, or the applied external force, may each be varied alone or in combination, as desired 730. Once sufficient evaluation tests have been completed, then the data results may be assessed 740 as needed for the design of the particular system within which the rechargeable battery may be employed. Note that a variety of data may be collected and analyzed as part of this process including, for instance, temperature, voltage and internal cell resistance, whether the evaluation process resulted in a failure event of the rechargeable battery, etc.

Figure 8:
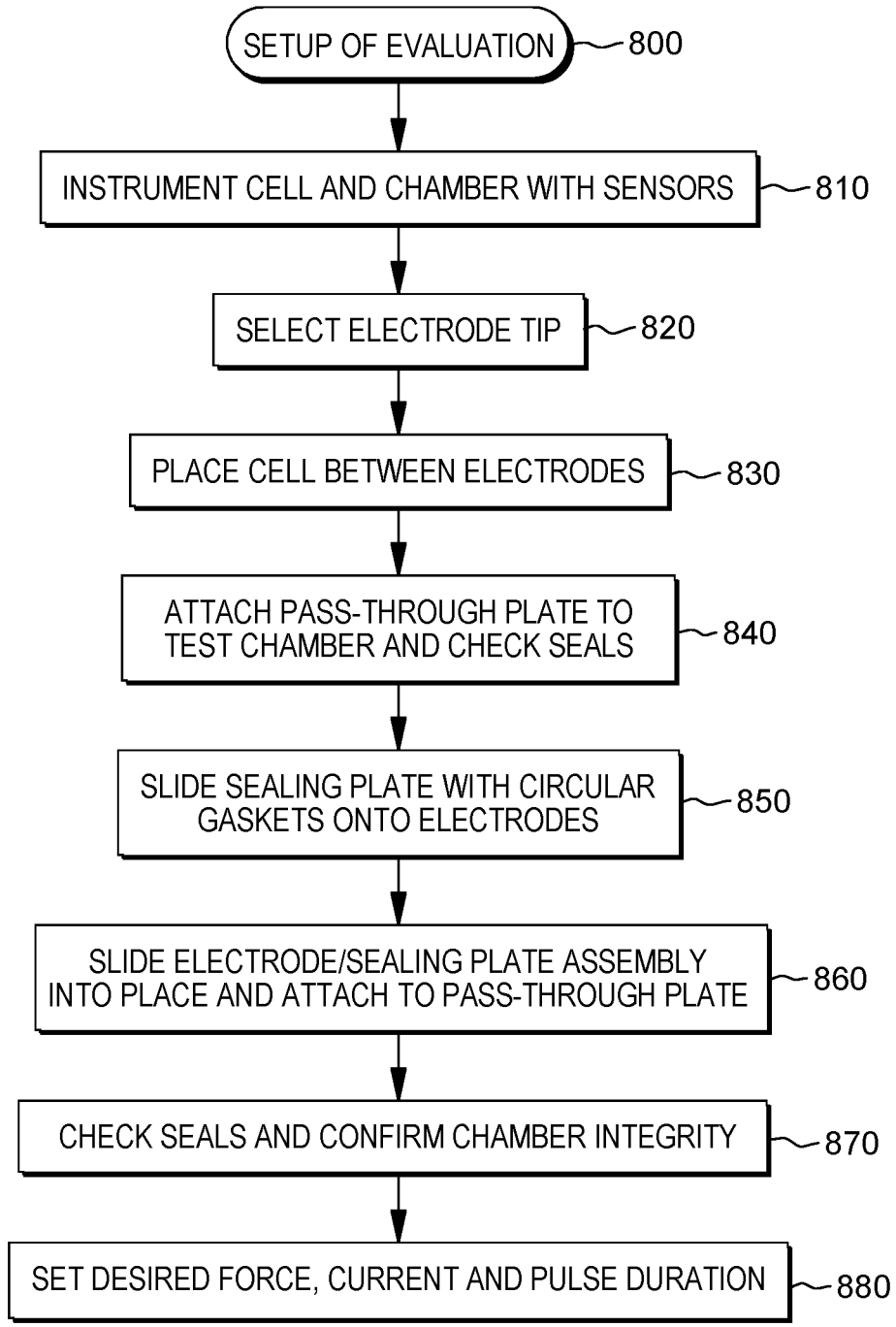
FIG. 8 depicts one embodiment of logic for setting up evaluation of a rechargeable battery using an apparatus, in accordance with one or more aspects of the present invention.

FIG. 8 depicts one embodiment of logic for setting up an evaluation process 800. The battery cell and chamber are instrumented with sensors 810, and one or both electrodes, or electrode tips are selected 820 for use in the evaluation. In one or more implementations, various sized contact surfaces and various configured contact surfaces may be available for selection as part of the evaluation process. For instance, in one or more embodiments, the first electrode may have a variety of pointed or rounded contacts surfaces available, or even concave surfaces, in the case of a cylindrical rechargeable battery, which may be differently configured and sized from the second contact surface of the second electrode. The battery cell may be placed between the first and second electrodes 830, and the pass-through plate attached to the test chamber, along with checking the seals 840. The sealing plate may be slid into position with the circular gaskets on the electrodes disposed between the pass-through plate and the sealing plate 850. The electrode/sealing plate assembly may then be moved into place and attached to the pass-through plate 860, and seals are checked and the enclosed chamber's integrity is confirmed 870. The desired external force, applied current and pulse duration may then be set, for instance, manually by a test operator, or in an automated fashion, as desired 880. Note in this regard that the application of pulse current to the rechargeable battery is generally not performed or even possible using other evaluation processes, but is in advantage of using a spot welding-type system, such as disclosed herein.

Figure 9B:
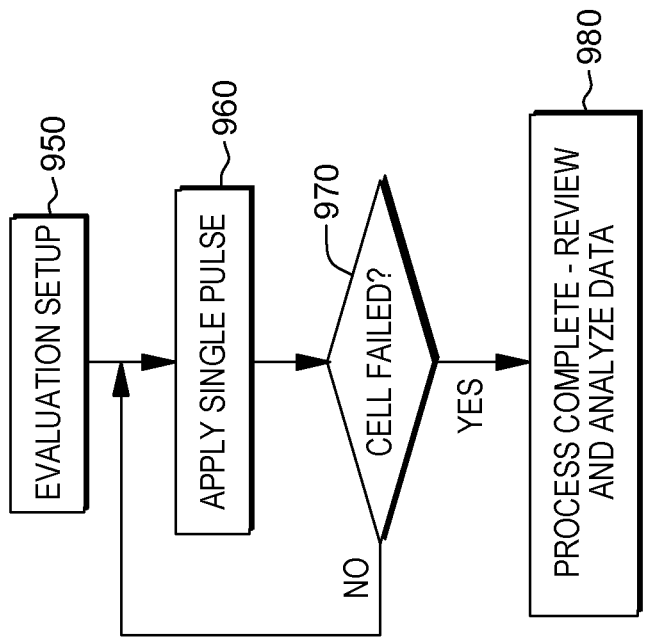
FIG. 9B depicts one embodiment of logic for evaluating a rechargeable battery by applying fixed current pulses to a rechargeable battery until failure using an apparatus, in accordance with one or more aspects of the present invention.
Figure 9A:
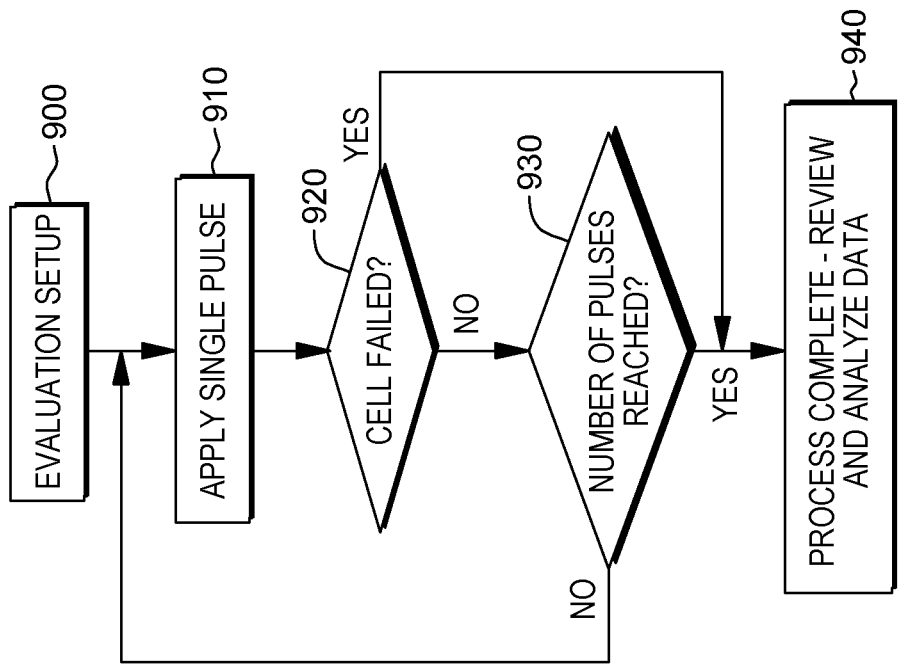
FIG. 9A depicts one embodiment of logic for evaluating a rechargeable battery by applying a specified number of fixed current pulses to a rechargeable battery using an apparatus, in accordance with one or more aspects of the present invention.

Using the apparatus disclosed herein, the evaluation process may be implemented in a number of ways. For instance, FIG. 9A depicts example logic of using a fixed number pulse process to evaluate a rechargeable battery, while the logic of FIG. 9B depicts a process for applying pulses until failure of the rechargeable battery. Referring first to the process of FIG. 9A, the evaluation setup is performed 900, such as described above in connection with FIG. 8, and a single pulse may be applied 910. Along with applying the single current pulse, a localized pressure, or external force, may also be applied, as desired based on the evaluation process being performed. In one or more embodiments, the controller may determine whether the battery cell failed 920, for instance, by monitoring voltage across the battery, and if "no", determine whether a specified number of pulses have been reached 930. If "no", then a next single pulse is applied, and the process is repeated until either battery cell failure is detected, or the number of specified pulses has been reached. Once reached, or if battery cell failure is detected, the process is complete and the data collected during the evaluation process may be reviewed and analyzed, for instance, to determine whether the rechargeable battery passes the test, or if failing, determine at what point failure occurred, and what the effect of failure was on the venting process and the structure of the rechargeable battery.

In the process of FIG. 9B, the evaluation setup 950 may again be performed, similar to the process depicted in FIG. 8, and a single pulse 960 may be applied, along with (if desired) a localized pressure. Processing determines whether the battery cell has failed 970, and if "no", then a next single pulse is applied 960. This process may continue until battery failure is confirmed by the controller, and once confirmed, the process may be deemed complete. The collected data may then be reviewed and analyzed 980 to, for instance, determine the point of battery cell failure, and the effect of the failure on the battery cell, and the surrounding environment (within the enclosed chamber).

One example of a computer system that includes processors that may be used by one or more aspects of the present invention is described with reference to FIG. 10. In this example, the computer system is part of a computing environment including additional components that may or may not be used by aspects of the present invention.

Figure 10:
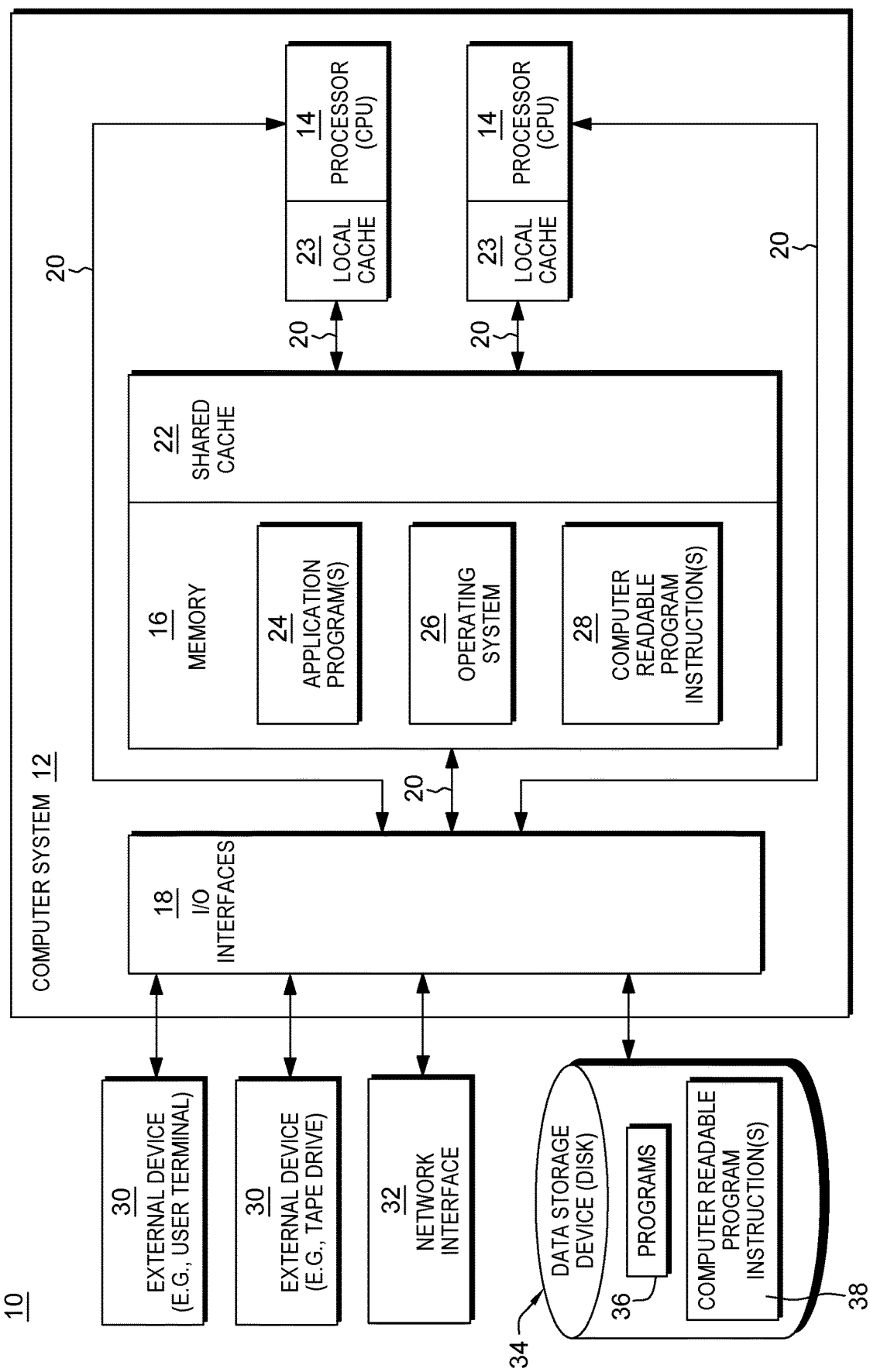
FIG. 10 depicts one embodiment of a computing system which may implement or facilitate implementing one or more control aspects of rechargeable battery evaluation using an apparatus, in accordance with one or more aspects of the present invention.

As shown in FIG. 10, a computing environment 10 includes, for instance, a computer system 12 shown, e.g., in the form of a general-purpose computing device. Computer system 12 may include, but is not limited to, one or more processors or processing units 14 (e.g., central processing units (CPUs)), a memory 16 (a.k.a., system memory, main memory, main storage, central storage or storage, as examples), and one or more input/output (I/O) interfaces 18, coupled to one another via one or more buses and/or other connections 20.

Bus 20 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 16 may include, for instance, a cache 22, such as a shared cache, which may be coupled to local caches 23 of processors 14. Further, memory 16 may include one or more programs or applications 24, an operating system 26, and one or more computer readable program instructions 28. Computer readable program instructions 28 may be configured to carry out functions of embodiments of aspects of the invention.

Computer system 12 may also communicate via, e.g., I/O interfaces 18 with one or more external devices 30, one or more network interfaces 32, and/or one or more data storage devices 34. Example external devices include a user terminal, a tape drive, a pointing device, a display, etc. Network interface 32 enables computer system 12 to communicate with one or more networks, such as a local area network (LAN), a general wide area network (WAN), and/or a public network (e.g., the Internet), providing communication with other computing devices or systems.

Data storage device 34 may store one or more programs 36, one or more computer readable program instructions 38, and/or data, etc. The computer readable program instructions may be configured to carry out functions of embodiments of aspects of the invention.

Computer system 12 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 12. Examples, include, but are not limited to: microcode, device drivers, redundant processing units, external disk drive arrays, RAID systems, tape drives, and data archival storage systems, etc.

Computer system 12 may be operational with numerous other general purpose or special purpose computing system environments or configurations. Examples of well-known computing systems, environments, and/or configurations that may be suitable for use with computer system 12 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

In one example, a processor, such as processor 14, may execute one or more components to perform one or more aspects of the present invention. These components may be stored in memory, including main memory (e.g., memory 16) and/or one or more caches (e.g., shared cache 22, local cache 23) and/or external storage (e.g., device 34), and may be executed by one or more processors (e.g., processor 14).

In one example, the components may include a control engine used in controlling operation of the spot welding-type system to produce a localized pressure on, and a localized heating of, the rechargeable battery in a spot-sized region; a monitoring engine for monitoring one or more properties associated with rechargeable battery during the applying of the localized pressure and localized heating to the rechargeable battery by the spot welding-type system to facilitate evaluating potential internal short circuiting of the rechargeable battery, and one or more resultant effects thereof; and an evaluation engine for assessing data results from the applying of the localized pressure and localized heating to the rechargeable battery by the spot welding-type system. The components executed by a processor may be individual components or combined in one component. Further, other components may be included to perform one or more other tasks. Many variations are possible.

One or more aspects may relate to cloud computing.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 11:
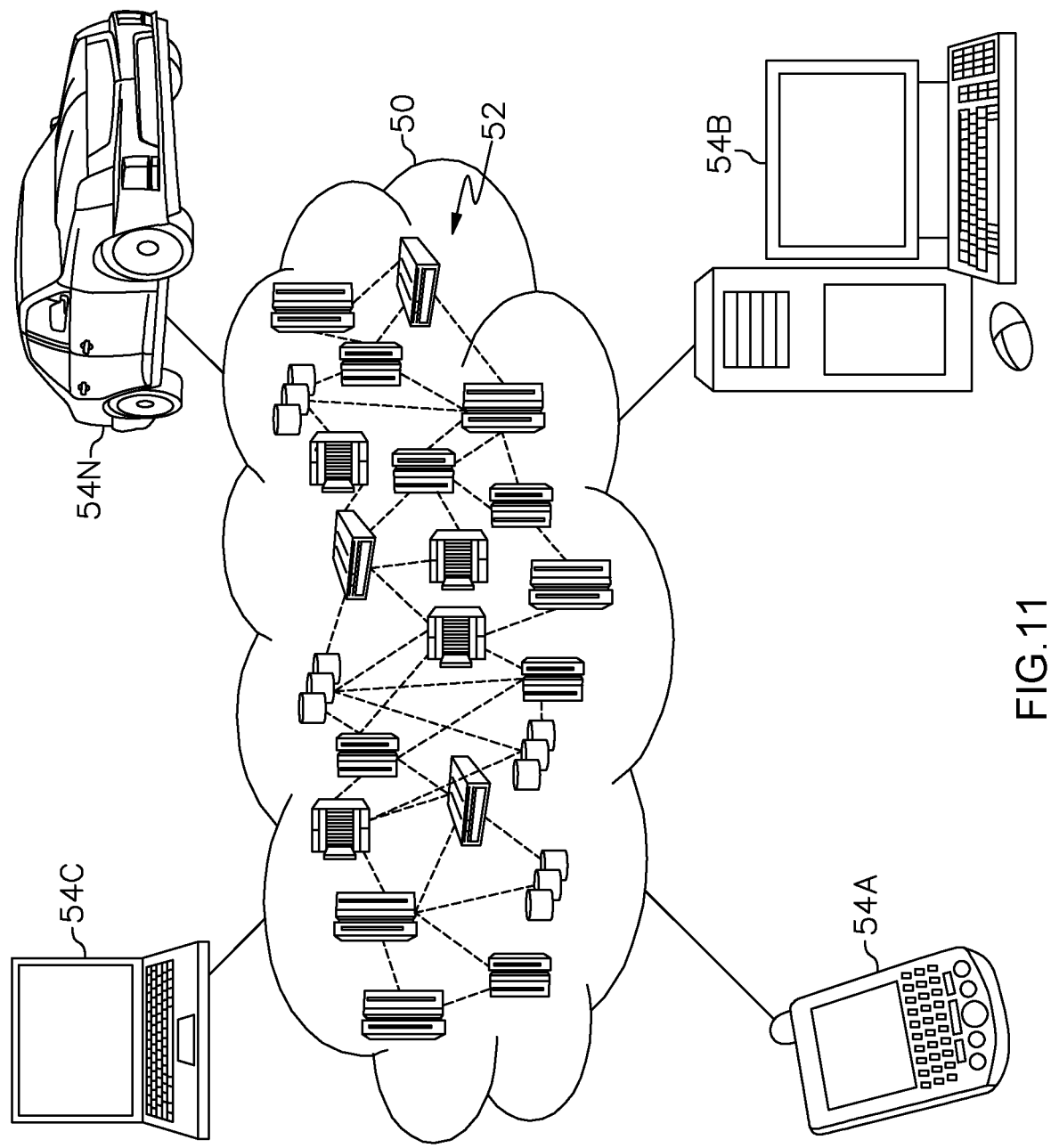
FIG. 11 depicts one embodiment of a cloud computing environment, which may implement, or be used in association with one or more aspects of the present invention.

Referring now to FIG. 11, illustrative cloud computing environment 50 is depicted. As shown, cloud computing environment 50 comprises one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 52 and cloud computing environment 50 can communicate with any type of computerized device over any type of network and/or network addressable connection (e.g., using a web browser).

Figure 12:
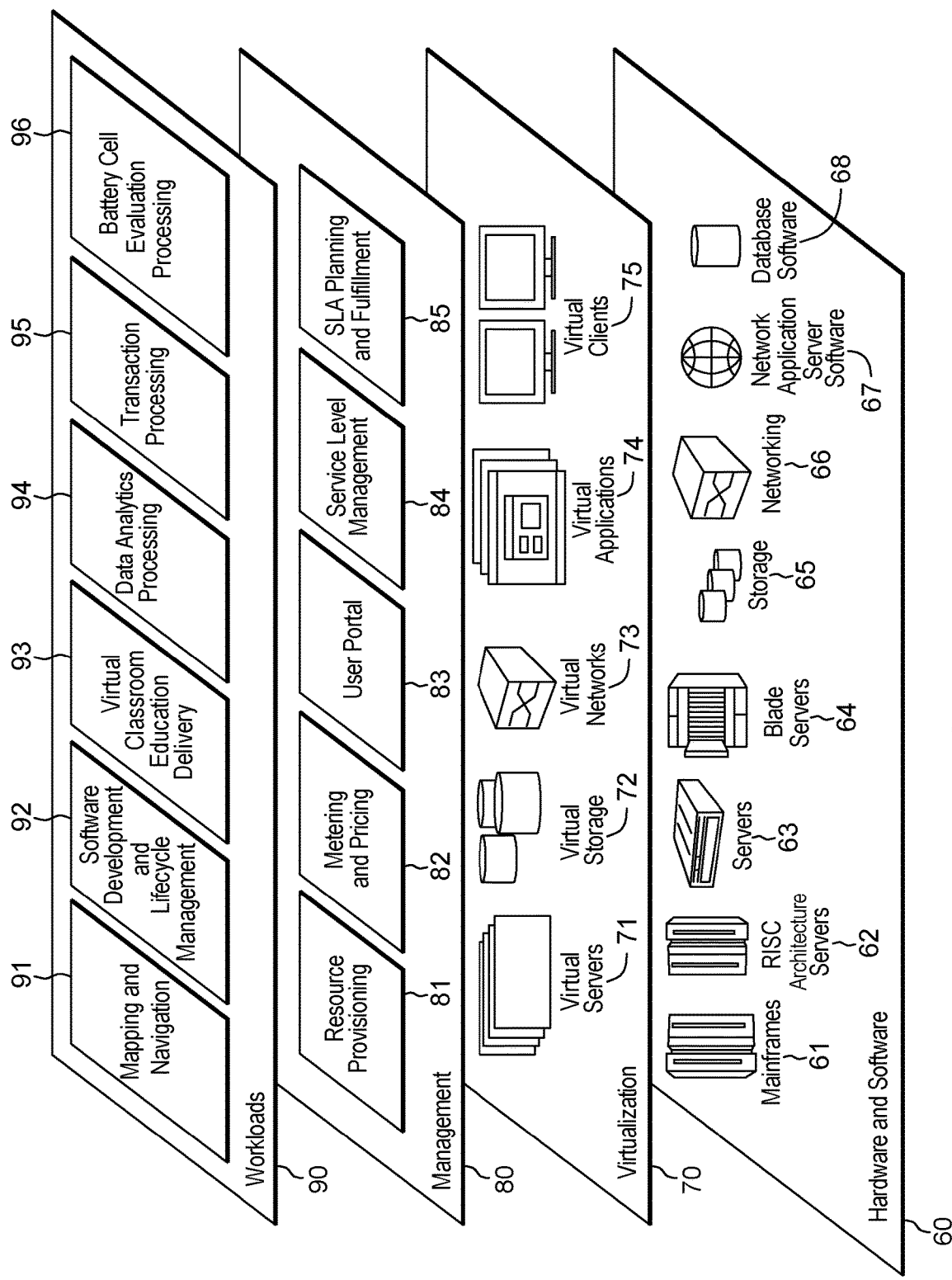
FIG. 12 depicts one example of abstraction model layers, which may facilitate or implement one or more aspects of evaluating a rechargeable battery, in accordance with one or more aspects of the present invention.

Referring now to FIG. 12, a set of functional abstraction layers provided by cloud computing environment 50 (FIG. 11) is shown. It should be understood in advance that the components, layers, and functions shown in FIG. 12 are intended to be illustrative only and embodiments of the invention are not limited thereto. As depicted, the following layers and corresponding functions are provided.

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and battery cell evaluation processing 96, which may include assessing results of the battery cell evaluation.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention.

In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, other types of devices and/or tracking components may be used in one or more embodiments. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus for facilitating evaluating a rechargeable battery, the apparatus comprising:
    a spot welding-type system adapted to facilitate evaluating the rechargeable battery, the spot welding-type system comprising;
        a first electrode including a first contact surface configured to facilitate inducing an internal short circuit within the rechargeable battery when in contact therewith during operation of the spot welding-type system;
        a second electrode including a second contact surface to also contact the rechargeable battery and clamp the rechargeable battery between the first electrode and the second electrode during operation of the spot welding-type system to apply a localized pressure to the rechargeable battery, and to spot-heat the rechargeable battery, by applying current pulses between the first and second electrodes, to thereby induce the internal short circuit, the first and second contact surfaces being dissimilar contact surfaces, and the second contact surface being larger than the first contact surface; and
    wherein the spot welding-type system with the rechargeable battery disposed between the first and second contact surfaces produces, in operation, a localized pressure on, and a localized heating of, the rechargeable battery in a spot-sized region local to the first contact surface of the first electrode, where the first contact surface contacts the rechargeable battery to facilitate evaluating a potential internal short circuiting of the rechargeable battery.

2. The apparatus of claim 1, wherein the spot welding-type system further comprises a controller, the controller controlling at least one operational parameter of the spot welding-type system selected from the group consisting of a magnitude of an applied force by the first and second electrodes on the rechargeable battery, a duration of the applied force on the rechargeable battery, a magnitude of a pulse current applied to the rechargeable battery via the first and second electrodes, and a duration of the pulse current applied to the rechargeable battery.

3. The apparatus of claim 2, wherein controlling by the controller the at least one operational parameter of the spot welding-type system facilitates applying the localized pressure and localized heating to the rechargeable battery at levels to degrade a separator of the rechargeable battery and produce an internal short circuit.

4. The apparatus of claim 2, wherein controlling by the controller the at least one operational parameter of the spot welding-type system provides control over size of a defect produced in a separator of the rechargeable battery by application of the localized pressure and localized heating, resulting in an internal short circuit in the rechargeable battery.

5. The apparatus of claim 2, wherein the controller is programmable to allow adjusting of the at least one operational parameter of the spot welding-type system.

6. The apparatus of claim 1, further comprising an enclosed chamber, wherein the first and second electrodes of the spot welding-type system extend into the enclosed chamber, and during operation of the spot welding-type system, the first and second contact surfaces hold the rechargeable battery therebetween within the enclosed chamber, the enclosed chamber being a sealed chamber, and the apparatus further comprising sealing gaskets surrounding the first and second electrodes where the first and second electrodes extend into the enclosed chamber.

7. The apparatus of claim 1, wherein the second contact surface of the second electrode is configured to facilitate holding the rechargeable battery during operation of the spot welding-type system.

8. The apparatus of claim 1, wherein the first contact surface is a convex contact surface.

9. The apparatus of claim 8, wherein the second contact surface is a concave contact surface.

10. The apparatus of claim 8, wherein the first electrode is a positive electrode, and the second electrode is a negative electrode.

11. An apparatus for facilitating evaluating a rechargeable battery, the apparatus comprising:
    a spot welding-type system adapted to facilitate evaluating the rechargeable battery, the spot welding-type system comprising:
        a first electrode including a first contact surface configured to facilitate inducing an internal short circuit within the rechargeable battery when in contact therewith during operation of the spot welding-type system;
        a second electrode including a second contact surface to also contact the rechargeable battery and clamp the rechargeable battery between the first electrode and the second electrode during operation of the spot welding-type system to apply a localized pressure to the rechargeable battery, and to spot-heat the rechargeable battery, by applying current pulses between the first and second electrodes, to thereby induce the internal short circuit, the first and second contact surfaces being dissimilar contact surfaces, and the second contact surface being larger than the first contact surface; and
        a controller, the spot welding-type system with the rechargeable battery disposed between the first and second contact surfaces producing, in operation, a localized pressure on, and a localized heating of, the rechargeable battery in a spot-sized region local to the first contact surface of the first electrode, where the first contact surface contacts the rechargeable battery to facilitate evaluating a potential internal short circuiting of the rechargeable battery, and the controller controlling the localized pressure on, and the localized heating of, the rechargeable battery in the spot-sized region.

12. The apparatus of claim 11, wherein the spot welding-type system further comprises a force generation mechanism coupled to at least one of the first and second electrodes to apply a force on the rechargeable battery when the rechargeable battery is disposed between the first and second electrodes.

13. The apparatus of claim 12, wherein the controller controls at least one operational parameter of the spot welding-type system selected from the group consisting of a magnitude of the applied force on the rechargeable battery, a duration of the applied force on the rechargeable battery, a magnitude of a pulse current applied to the rechargeable battery via the first and second electrodes, and a duration of the pulse current applied to the rechargeable battery.

14. The apparatus of claim 13, wherein the controller controls the at least one operational parameter of the spot welding-type system to facilitate applying the localized pressure and localized heating to the rechargeable battery at levels to degrade a separator of the rechargeable battery and produce an internal short circuit.

15. The apparatus of claim 13, wherein the controller controls the at least one operational parameter of the spot welding-type system to provide control over size of a defect produced in a separator of the rechargeable battery by the application of the localized pressure and localized heating, resulting in an internal short circuit in the rechargeable battery of a controlled defect size.

16. The apparatus of claim 11, wherein the first contact surface is a convex contact surface, and the second contact surface is a non-convex contact surface.

17. A method of evaluating a rechargeable battery, the method comprising:
   applying, via a spot welding-type system, a localized pressure and a localized heating to the rechargeable battery in a spot-sized region of the rechargeable battery to facilitate evaluating a potential internal short circuiting of the rechargeable battery, the applying including:
      placing the rechargeable battery between a first electrode and a second electrode of the spot welding-type system, the first electrode being configured with a first contact surface to facilitate inducing an internal short circuit within the rechargeable battery during operation of the spot welding-type system, and the second electrode being configured with a second contact surface to contact the rechargeable battery and clamp the rechargeable battery between the first electrode and the second electrode during operation of the spot welding-type system to apply a localized pressure to the rechargeable battery, and to spot-heat the rechargeable battery, by applying current pulses between the first and second electrodes, to thereby induce the internal short circuit, the first and second contact surfaces being dissimilar contact surfaces, and the second contact surface being larger than the first contact surface; and
   monitoring one or more properties associated with the rechargeable battery during the applying of the localized pressure and the localized heating to the rechargeable battery by the spot welding-type system to facilitate evaluating the potential internal short circuiting of the rechargeable battery, and one or more resultant effects thereof.

18. The method of claim 17, wherein the applying, via the spot welding-type system, of the localized pressure and localized heating occurs within an enclosed chamber.

19. The method of claim 18, wherein the applying includes controlling, via a controller of the spot welding-type system, at least one operational parameter of the spot welding-type system, the at least one operational parameter being selected from the group consisting of a magnitude of an applied force by the first and second electrodes on the rechargeable battery, a duration of the applied force on the rechargeable battery, a magnitude of a pulse current applied to the rechargeable battery via the first and second electrodes, and a duration of the pulse current applied to the rechargeable battery.

20. The method of claim 19, wherein controlling the at least one operational parameter of the spot welding-type system facilitates applying the localized pressure and the localized heating to the rechargeable battery at levels to degrade a separator of the rechargeable battery and produce an internal short circuit.

* * * * *